| United States Patent [19] | [11] | 4,029,466 |
|---|---|---|
| Ishii et al. | [45] | June 14, 1977 |

[54] CONTAINER FOR EVAPORATION OF METAL

[75] Inventors: Masaji Ishii; Akio Mikogami; Akira Miyai, all of Machida, Japan

[73] Assignee: Denki Kagaku Kogyo Kabushiki Kaisha, Tokyo, Japan

[22] Filed: Aug. 8, 1975

[21] Appl. No.: 603,140

[30] Foreign Application Priority Data

Aug. 8, 1974 Japan .............................. 49-90972
Aug. 8, 1974 Japan .............................. 49-90971

[52] U.S. Cl. ................ 432/264; 266/275; 432/265
[51] Int. Cl.$^2$ .................. F27B 14/10; F27B 14/06
[58] Field of Search ............ 432/264, 265; 266/39, 266/275

[56] References Cited

UNITED STATES PATENTS

| 3,151,852 | 10/1964 | Weech et al. ..................... 432/264 |
| 3,216,710 | 11/1965 | Lenihan, Jr. et al. ............. 432/264 |
| 3,553,800 | 1/1971 | Ploger et al. ..................... 432/265 |

*Primary Examiner*—John J. Camby
*Attorney, Agent, or Firm*—Oblon, Fisher, Spivak, McClelland & Maier

[57] ABSTRACT

Metal is evaporated in a container which comprises an electrically conductive ceramic base whose surface in contact with the molten metal is coated with a film comprising, a main component selected from the group consisting of titanium carbide, zirconium carbide, hafnium carbide, vanadium carbide, niobium carbide, tantalum carbide, chromium carbide, molybdenum carbide, tungsten carbide, tungsten metal, tantalum metal and molybdenum metal.

6 Claims, No Drawings

CONTAINER FOR EVAPORATION OF METAL

BACKGROUND OF THE INVENTION

1. Field of the Invention

The present invention relates to an improved container for the vacuum evaporation of metal which is made of a conductive ceramic. More particularly, it relates to a container for the evaporation of metal which has excellent wettability to molten metal and which enables the use of a high evaporation speed.

2. Description of the Prior Art

Heretofore, containers used for the evaporation of metal have been made of a metal having a high melting point, such as tungsten (W), tantalum (Ta), molybdenum (Mo) and the like. These containers, typically of the boat type, have excellent wettability to molten metals but are easily corroded and are difficult to use repeatedly. Additionally, containers of the vacuum evaporation of metal can be made of an electrically conductive ceramic of $TiB_2$, $ZrB_2$ and the like, which is highly anticorrosive and conductive. The containers are superior to the metallic containers since they can be repeatedly used. However, they suffer from a serious disadvantage in that they possess inferior wettability to molten metal.

In vacuum evaporation, a molten metal is primarily heated by thermal conduction from the surface of the container. Consequently, if the container is not wettable to molten metal, the surface of the container will not be substantially wetted by the molten metal and low thermal conduction will result. Accordingly, it takes a correspondingly longer time to reach a sufficiently high temperature for the molten metal and fast evaporation rates cannot be achieved. Consequently, it would be most desirable to have a material for a container, used to evaporate metal, which is both highly anticorrosive and which maintains high wettability to the molten metal.

SUMMARY OF THE INVENTION

Accordingly, it is an object of the present invention to provide a container for the evaporation of metal which has excellent wettability to molten metal enabling use of a high evaporating speed.

This and other objects of the invention as will hereinafter become clear by the ensuing discussion have been attained by providing a container for the evaporation of metal which comprises an electrically conductive ceramic base whose surface in contact with the molten metal is coated with a film comprising a main component selected from the group consisting of titanium carbide, zirconium carbide, hafnium carbide, vanadium carbide, niobium carbide, tantalum carbide, chromium carbide, molybdenum carbide, tungsten carbide, tungsten metal, tantalum metal and molybdenum metal.

DETAILED DESCRIPTION OF THE PREFERRED EMBODIMENTS

Suitable containers for the evaporation of metal include boats, crucibles and other conventional devices used for vacuum evaporation coating. The electrically conductive ceramics used in this invention are composites comprising 20 – 95 wt. % of an electrically conductive anticorrosive refractory compound such as $TiB_2$, $ZrB_2$ and the like, and a remainder of an electrically insulating anticorrosive compound such as BN, AlN and the like. The composites have a specific resistance of 40 – 6000 $\mu\Omega$-cm.

Suitable carbides used for coating the electrically conductive ceramic include titanium carbide, zirconium carbide, hafnium carbide, vanadium carbide, niobium carbide, tantalum carbide, chromium carbide, molybdenum carbide, tungsten carbide, and mixtures thereof. These carbides are highly wettable to molten metals commonly used in evaporative systems such as aluminum, nichrome and the like, and have a relatively low vapor pressure at high temperature. Tungsten, tantalum, and molybdenum are metals having a high melting point which are also used for the coating of a container for vacuum evaporative coating.

These metals are highly wettable to molten metals such as aluminum, nichrome and the like, and also have a relatively low vapor pressure at high temperature.

These carbides and metals can be combined with other ceramics and metals but it is necessary to include more than 30 wt.% of the component of this invention. When the content of the specific carbide or metal is less than 30 wt.%, the wettability of the molten metal is disadvantageously inferior.

Conventional methods for coating the surface of the container made of the electrically conductive ceramic with the specific carbide or metal can be used. However, the following techniques are preferred:

1. the coat-drying method;
2. the molten injecting method; and
3. the evaporation coating method, and the like.

In the coat-drying method, a suspension of a powder of the specific carbide or metal in a vaporizable medium such as water, toluene, hexane and the like, is coated onto the surface of the container. It is then dried and sintered.

In another coat-drying method, a mixture of the powder of the specific carbide or metal with an aqueous dispersion of alumina sol, silca sol or aluminum nitrate, is coated onto the surface of the container and is dried and sintered.

The temperature for drying the coating is preferably in the range of 60°–200° C. The temperature for sintering is preferably in the range of 200°–1000° C.

The thickness of the coating is preferably in the range of 30 – 300 $\mu$m. In the molten injecting method, it is preferable to inject a molten carbide by a conventional method, or to inject a molten metal (200 – 300 mesh). In the evaporation coating method, a gaseous mixture of methane gas and a metal chloride corresponding to the specific carbide is passed into a reactor at a pressure of $10^{-4} - 10^{-1}$ Torr, in order to solidify the specific carbide onto the surface of the container made of the electrically conductive ceramic which is heated to 800° – 1600° C.

In using the evaporation coating method for a metal, a gas of a chloride such as tungsten chloride ($WCl_6$) is reduced in a hydrogen gas flow at higher than 700° C, in order to solidify the specific metal such as tungsten onto the surface of the container thereby forming a coating.

Having generally described the invention, a more complete understanding can be obtained by reference to certain specific examples, which are included for purposes of illustration only and are not intended to be limiting unless otherwise specified.

In the Examples, the containers are boats used for vacuum evaporation coating (hereinafter referred to simply as a boat).

EXAMPLE 1

The boats to be coated were made of an electrically conductive ceramic having a main component of $TiB_2$ (manufactured by Denki Kagaku Kogyo K.K.) and was a rod having a width of 6 mm, a thickness of 4 mm and a length of 100 mm. It had a cavity with a width of 4 mm, a length of 40 mm and a depth of 2 mm in its center.

Onto the inner surface of the cavity of each boat, a suspension of 20 parts by volume of a fine powder of TiC, ZrC, HfC, VC, NbC, TaC, $Cr_3C_2$, $Mo_2C$ or WC (325 mesh pass) in 80 parts by volume of water was coated with a brush. It was dried in a drier at 120° C. After drying for 30 minutes, 0.2 g of nichrome wire (Ni 80%; Cr 20%) having a diameter of 1 mm was put in the cavity. The boat was placed in a vacuum evaporation coating apparatus in order to conduct an evaporation coating test.

In the evaporation, a voltage of 8 volts was applied between the ends of the boat at a pressure of $3 \times 10^{-6}$ Torr for 40 seconds. After the application the boat was removed and the wetting condition of the cavity of the boat was observed. As a reference, the same test was repeated on a boat without a coating. The results are shown in Table 1.

TABLE 1

|  | Test No. | Carbides | Wetting condition by nichrome |
|---|---|---|---|
| Example 1 | 1 | TiC | Excellent |
|  | 2 | ZrC | Excellent |
|  | 3 | HfC | Excellent |
|  | 4 | VC | Good (there was a small unwetted part at an edge of the cavity) |
|  | 5 | NbC | Good |
|  | 6 | TaC | Excellent |
|  | 7 | $Cr_3C_2$ | Excellent |
|  | 8 | MoC | Good |
|  | 9 | WC | Excellent |
| Reference | 10 | No coating | Only the central part of the cavity was wetted. Bumping was present during the evaporation. |

EXAMPLE 2

10 wt. parts of alumina sol (10% $Al_2O_3$ manufactured by Nissan Chemical Co., Ltd.) was added to 100 wt. parts of a mixture of 50 wt. % of TiC and 50 wt. % of $Al_2O_3$. The mixture was molded in a mold and was sintered at 1000° C in a nitrogen gas atmosphere for 30 minutes. The sintered product was crushed and sifted to obtain particles of 150 – 250 mesh.

The cavity of sintered boats as in Example 1 were coated by plasma molten injection of said particles. One of 0.3 g of aluminum, 0.2 g of antimony or 0.4 g of nickel was placed in the cavity. The boat was placed in a vacuum evaporation coating apparatus to conduct an evaporation test under the conditions of Example 1.

As a reference, the same test was repeated with no coating for the boat. The results of the wetting test on the boat by the above metals and the times required for completing the evaporations are shown in Table 2.

TABLE 2

|  | Test No. | Metal for evaporation | Coating | Wetting condition by the metal | Time for completing evaporation (sec.) |
|---|---|---|---|---|---|
| Example 2 | 11 | Al | coated | excellent | 25 |
| Example 2 | 12 | Sb | coated | excellent | 45 |
| Example 2 | 13 | Ni | coated | excellent | 62 |
| Reference | 14 | Al | none | many unwetted spherical portions; slow evaporation | 220 |
| Reference | 15 | Sb | None | the two edges of cavity were not wetted | 322 |
| Reference | 16 | Ni | none | many unwetted spherical portions; quite slow evaporation | — |

EXAMPLE 3

A boat was coated in accordance with the process of Example 1 except for the use of a suspension of 20 parts by volume of a fine powder of W, Mo or Ta (325 mesh pass) in 80 parts by volume of acetone instead of the suspension of a carbide.

0.3 g of aluminum wire having a diameter of 1.2 mm was put in the cavity, and the boat was set in a vacuum evaporation coating apparatus to perform an evaporation coating test.

During the evaporation, a voltage of 8 volts was applied between the ends of the boat at a pressure of $2 \times 10^{-6}$ Torr. After about 10 seconds from the initiation, the aluminum wire began to melt. After melting was completed, the boat was taken out and the wetting condition of the cavity of the boat was assessed. As a reference, the same test was repeated without the coating on the boat. The results are shown in Table 3.

TABLE 3

|  | Test No. | Coating metal | Wetting condition by aluminum |
|---|---|---|---|
| Example 3 | 17 | W | good |
|  | 18 | Mo | excellent |
|  | 19 | Ta | excellent |
|  | 20 | W 50%; Ta 50% | excellent |
|  | 21 | Mo 40%; $Al_2O_3$ 60% | good |
| Reference | 22 | none | cavity is not wetted by aluminum |

EXAMPLE 4

The cavities of several boats of Example 3 were coated by argon-plasma molten injection of molybdenum metal powder (100 – 200 mesh). 0.3 g of aluminum, 0.2 g of antimony or 0.4 g of nickel were separately placed in a cavity. The boats were set in a vacuum evaporation coating apparatus to perform a test of evaporation by applying 8 volts between the ends of the boats at a pressure of $2 \times 10^{-6}$ Torr.

As a reference, the same test was repeated without the coating on the boat. The results of the wetting by the metals of the boats and the times for completing the evaporations are shown in Table 4.

TABLE 4

|  | Test No. | Metal for evaporation | Coating | Wetting condition by the metal | Time for completing evaporation (sec.) |
| --- | --- | --- | --- | --- | --- |
| Example 4 | 23 | Al | coated | good | 30 |
| Example 4 | 24 | Sb | coated | good | 55 |
| Example 4 | 25 | Ni | coated | good | 65 |
| Reference | 26 | Al | none | many unwetted spherical portions low evaporation | 220 |
| Reference | 27 | Sb | none | two edges of the cavity were not wetted | 322 |
| Reference | 28 | Ni | none | many unwetted spherical portions quite low evaporation | — |

EXAMPLE 5

Boats were coated in accordance with the process of Example 1 except for coating with each of the following coating compositions: 40 wt. % of ZrC — 60 wt. % of W; 70 wt. % of TiC — 30 wt. % of Mo; or 20 wt. % of TaC — 80 wt. % of Ta. 0.2 g of nichrom wire was placed in each cavity. The boats were set in a vacuum evaporation coating apparatus in order to conduct an evaporation coating test in accordance with the process of Example 1. The results are shown in Table 5.

TABLE 5

|  | Test No. | Coating composition | Wetting condition by the metal |
| --- | --- | --- | --- |
| Example 5 | 29 | 40 ZrC – 60 W | Excellent |
|  | 30 | 70 TiC – 30 Mo | Excellent |
|  | 31 | 20 TaC – 80 Ta | Good |

As is clear from the examples and references, the wetting property toward molten metals of the containers of the invention for the evaporation of metal, is excellent. As a result there is high thermal conductivity from the container to the molten metal and a high evaporating rate can be used. Accordingly, the containers of the invention are superior to conventional ones.

Having now fully described the invention, it will be apparent to one or ordinary skill in the art that many changes and modifications can be made thereto without departing from the spirit or scope of the invention as set forth herein.

What is claimed as new and desired to be secured by letters patent of the United States is:

1. A container for the evaporation of metal which comprises:
    an electrically conductive ceramic base whose surface in contact with the molten metal is coated with a film comprising a main component selected from the group consisting of tungsten, tantalum and molybdenum metal.

2. The container of claim 1, which is a cavity-containing boat.

3. The container of claim 1, which is a crucible.

4. The container of claim 1, wherein the electrically conductive ceramic comprises 20 – 95 wt. % of an electrically conductive anticorrosive material and a remainder of an electrically insulating anticorrosive material, and has a specific resistance of 40 – 6000 $\mu\Omega$-cm.

5. The container of claim 1, wherein the content of the metal in the coating is more than 30 wt. %

6. The container of claim 1, wherein the coating has a thickness between 30 – 300 $\mu$m.

* * * * *